(12) United States Patent
Nakamura

(10) Patent No.: US 11,056,361 B2
(45) Date of Patent: Jul. 6, 2021

(54) LAMINATE PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

(*) Notice: Subject to any disclaimer, the term of this patent is extended or adjusted under 35 U.S.C. 154(b) by 94 days.

(21) Appl. No.: 16/680,625

(22) Filed: Nov. 12, 2019

(65) Prior Publication Data
US 2020/0161150 A1    May 21, 2020

(30) Foreign Application Priority Data
Nov. 15, 2018  (JP) .............................. JP2018-214793

(51) Int. Cl.
*H01L 21/78* (2006.01)
*H01L 21/67* (2006.01)
*H01L 21/683* (2006.01)

(52) U.S. Cl.
CPC .. *H01L 21/67092* (2013.01); *H01L 21/67132* (2013.01); *H01L 21/6836* (2013.01); *H01L 21/78* (2013.01); *H01L 2221/6839* (2013.01); *H01L 2221/68327* (2013.01)

(58) Field of Classification Search
USPC ......................................................... 438/115
See application file for complete search history.

(56) References Cited

U.S. PATENT DOCUMENTS

| | | | |
|---|---|---|---|
| 2005/0186760 A1* | 8/2005 | Hashimura | B23K 26/18 438/460 |
| 2012/0247658 A1 | 10/2012 | Kawada | |
| 2014/0099777 A1* | 4/2014 | Mackh | H01L 21/6836 438/463 |
| 2016/0172312 A1 | 6/2016 | Nakamura et al. | |
| 2017/0358537 A1* | 12/2017 | Klingbeil | H01L 23/544 |
| 2018/0166491 A1* | 6/2018 | Nagata | H01L 21/563 |
| 2018/0345418 A1* | 12/2018 | Lei | H01L 21/78 |
| 2018/0350707 A1 | 12/2018 | Kishida | |

FOREIGN PATENT DOCUMENTS

| | | | |
|---|---|---|---|
| JP | 2010103327 A | 5/2010 | |
| JP | 2010108992 A | 5/2010 | |

OTHER PUBLICATIONS

Masaru Nakamura; U.S. Appl. No. 16/680,591, filed Nov. 12, 2019.

* cited by examiner

*Primary Examiner* — Xioming Liu
(74) *Attorney, Agent, or Firm* — Greer, Burns & Crain Ltd.

(57) ABSTRACT

A laminate processing method includes a water-soluble resin filling step of filling a water-soluble resin in a division groove formed in a dividing step, a modified layer removing step of positioning a cutting blade in the division groove formed in a back surface of a wafer to cut the division groove in a state in which the water-soluble resin is solidified or half-solidified, thereby removing a modified layer, and a water-soluble resin removing step of supplying cleaning water from the back surface of the wafer with a state in which an expandable tape is expanded being maintained, thereby removing the water-soluble resin being filled in a cut groove and the division groove.

3 Claims, 9 Drawing Sheets

LAMINATE PROCESSING METHOD

BACKGROUND OF THE INVENTION

Field of the Invention

The present invention relates to a laminate processing method of dividing a laminate in which a glass substrate is disposed through a transparent adhesive layer on a front surface of a wafer, into individual image sensor chips.

Description of the Related Art

A wafer is composed of a semiconductor substrate such as silicon, and a plurality of image sensors such as a complementary metal-oxide semiconductor (CMOS) image sensor and a charge-coupled device (CCD) image sensor are individually formed on an upper surface of the wafer in a plurality of separate regions defined by a plurality of division lines crossing each other. Such wafer is divided into individual image sensor chips by use of a dicing apparatus provided with a cutting blade in a rotatable manner, and a laser processing apparatus including focusing means which focuses a laser beam onto a workpiece to be processed. The image sensor chips thus divided are used in electric equipment such as a digital camera, a portable phone, a microscope, and the like.

An image sensor generally lowers its imaging function due to dust, a scratch, or the like. To eliminate this problem, a technique has been proposed in which a transparent member such as a glass is disposed on an upper surface of a wafer on which a plurality of image sensors are formed to thereby form a laminate so as to protect the image sensor from the scratch or the like.

For example, as means dividing the laminate described above into individual image sensor chips, a method of dividing a wafer by use of a dicing apparatus has been proposed (see Japanese Patent Laid-Open No. 2010-103327). Also, as another means dividing the laminate described above into individual image sensor chips, a method has been proposed in which a focal point of a laser beam having a transmission wavelength to the laminate is positioned inside the laminate to apply the laser beam thereto, a modified layer is then formed therein, and an external force is applied to the laminate to thereby divide the laminate into individual image sensor chips with the modified layer as a division start point (see Japanese Patent Laid-Open No. 2010-108992).

SUMMARY OF THE INVENTION

In a case where a laminate is divided through use of the technique disclosed in Japanese Patent Laid-Open No. 2010-103327, degradation in quality of the image sensor chip may be caused by a chipping in an outer periphery of the image sensor chip on the wafer side. In addition, in a case where a laminate is divided through use of the technique disclosed in Japanese Patent Laid-Open No. 2010-108992, degradation in quality of the image sensor chip may be caused by dust which is dropped from the modified layer in the wafer constituting the laminate.

It is therefore an object of the present invention to provide a laminate processing method with no degradation in quality described above, in dividing a laminate into individual chips, the laminate in which a glass substrate is disposed on a front surface of a wafer through a transparent adhesive layer.

In accordance with an aspect of the present invention, there is provided a laminate processing method of dividing a laminate into individual image sensor chips, the laminate in which a glass substrate is disposed through a transparent adhesive layer on a front surface of a wafer where a plurality of image sensors are formed in a plurality of respective regions demarcated by a plurality of crossing division lines, the method including: a cut groove forming step of positioning a cutting blade from a side of the glass substrate constituting the laminate and cutting a region of the glass substrate corresponding to each of the division lines, thereby forming a cut groove reaching the adhesive layer in the glass substrate; a division start point forming step of positioning a focal point of a laser beam having a transmission wavelength to the wafer inside a region of the wafer corresponding to each of the division lines from a back surface of the wafer, applying the laser beam thereto, continuously forming a modified layer inside the wafer, and forming a crack reaching from the modified layer to the adhesive layer, thereby forming a division start point; a laminate supporting step of supporting the glass substrate side of the laminate through an expandable tape to an annular frame having an inside opening with a size large enough to accommodate the laminate therein, at least after the cut groove forming step is carried out; a dividing step of, after the division start point forming step and the laminate supporting step are carried out, expanding the expandable tape to form a division groove along the division start point, and dividing the laminate into individual image sensor chips along the division groove; a water-soluble resin filling step of filling a water-soluble resin in the division groove formed in the dividing step; a modified layer removing step of positioning a cutting blade in the division groove formed in the back surface of the wafer to cut the division groove in a state in which the water-soluble resin is solidified or half-solidified, thereby removing the modified layer; and a water-soluble resin removing step of supplying cleaning water from the back surface of the wafer with a state in which the expandable tape is expanded being maintained, thereby removing the water-soluble resin being filled in the cut groove and the division groove.

Preferably, the water-soluble resin is coated on the back surface of the wafer in advance before the dividing step is carried out, and the water-soluble resin is filled in the division groove from the back surface of the wafer to carry out the water-soluble resin filling step when the laminate is divided into individual image sensor chips in the dividing step. Preferably, at any timing between completion of the dividing step and start of the water-soluble resin removing step, heat is applied to the expandable tape between an outer periphery of the laminate and the inside opening of the frame to shrink the expandable tape to thereby maintain the state in which the expandable tape is expanded.

According to the laminate processing method of the present invention, dust generated from the modified layer is smoothly discharged outside with the water-soluble resin, and a chipping is not generated in an outer periphery of the image sensor chips (CMOS and CCD) divided from the laminate, thereby preventing degradation in quality of the image sensor chips.

The above and other objects, features and advantages of the present invention and the manner of realizing them will become more apparent, and the invention itself will best be understood from a study of the following description and

DETAILED DESCRIPTION OF THE PREFERRED EMBODIMENT

Figure 1:
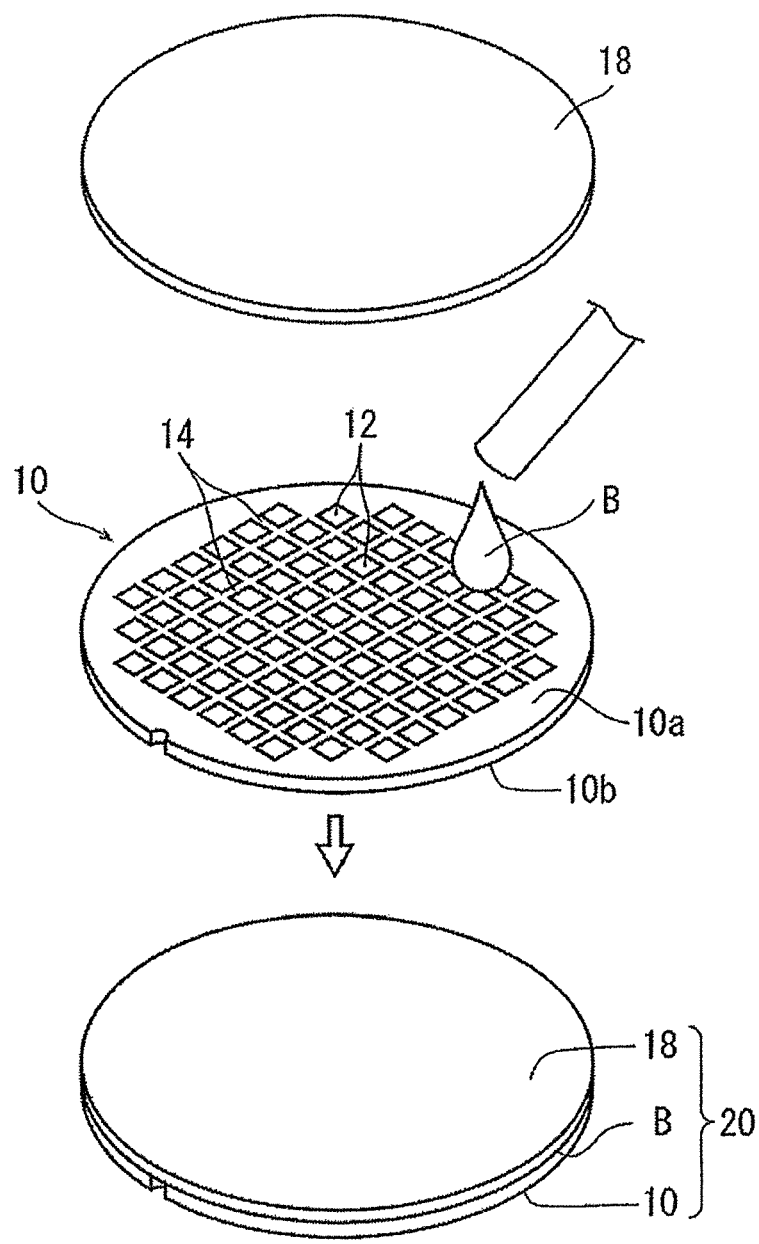
FIG. 1 is a perspective view illustrating a configuration of a laminate which is a workpiece in an embodiment of the present invention.

A laminate processing method according to an embodiment of the present invention will be described below with reference to the attached drawings. With reference to FIG. 1, a laminate serving as a workpiece in the embodiment of the present invention will be described. As illustrated in FIG. 1, first, a wafer 10 and a transparent glass substrate 18 are prepared. The wafer 10 has a front surface 10a and a back surface 10b, the front surface 10a being demarcated by a plurality of crossing division lines 14 into respective regions in a grid pattern where a plurality of image sensors (CMOS) 12 are formed. The crossing division lines 14 are composed of a plurality of parallel division lines 14 extending in a first direction, and a plurality of parallel division lines 14 extending in a second direction perpendicular to the first direction. After the wafer 10 and the glass substrate 18 are prepared, a transparent adhesive (resin bond) B is dropped on the front surface 10a of the wafer 10 to bond the wafer 10 to the glass substrate 18. In this manner, the wafer 10 and the glass substrate 18 are united with each other through an adhesive layer B formed from the above adhesive B to thereby form a laminate 20 (see a lower portion in FIG. 1).

(Cut Groove Forming Step)

Figure 2:
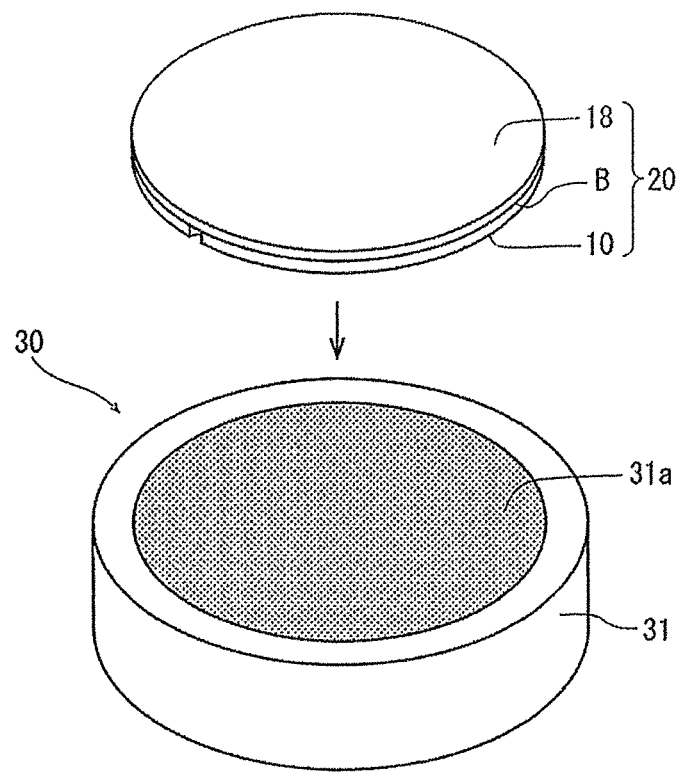
FIG. 2 is a perspective view illustrating a manner in which the laminate is held in a cutting apparatus.

After the laminate 20 is formed as described above, a cut groove forming step is carried out in which a cut groove is formed from the glass substrate 18 side of the laminate 20. The cut groove forming step will be described below with reference to FIGS. 2 and 3.

First, the laminate 20 is placed on a holding surface 31a of a holding table 31 included in a dicing apparatus 30 (only partly illustrated) with the glass substrate 18 side facing upward. The holding surface 31a is formed of a porous ceramic having a gas permeability and is connected with suction means not illustrated. After the laminate 20 is placed on the holding table 31, the suction means is operated to suck and hold the laminate 20.

Figure 3:
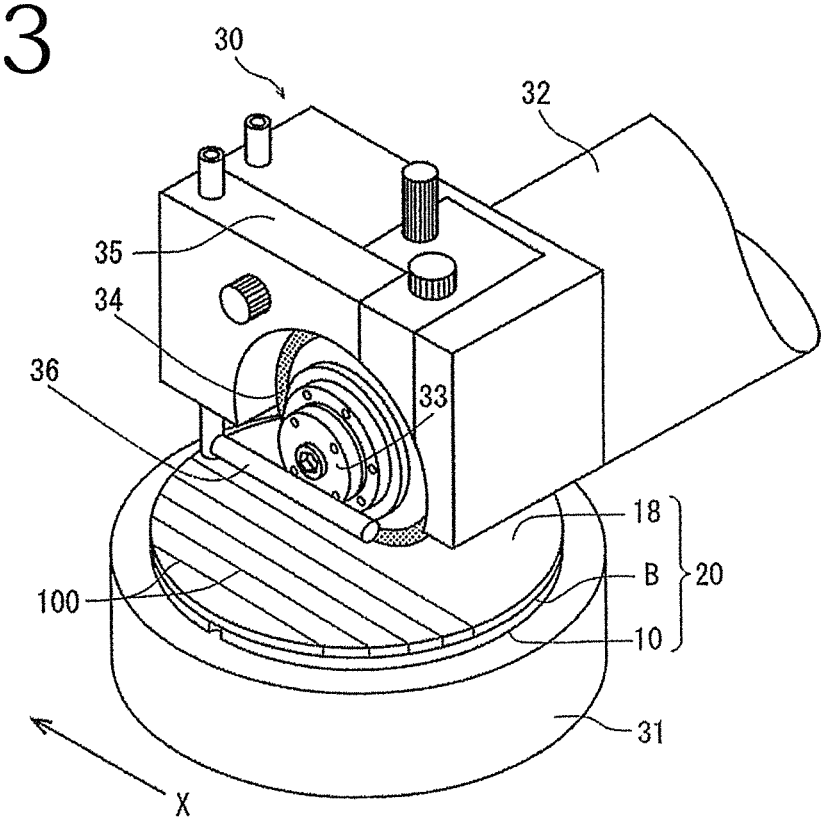
FIG. 3 is a perspective view illustrating a manner in which a cut groove forming step is carried out.

The dicing apparatus 30 includes a spindle unit 32 as illustrated in FIG. 3. The spindle unit 32 includes a spindle 33, a cutting blade 34 fixed to a distal end portion of the spindle 33 and having a cutting edge on an outer periphery thereof, and a blade cover 35 protecting the cutting blade 34. The cutting blade 34 is, for example, a resin bond grinding stone suitable for cutting the glass substrate 18 and is set to be 50 mm in diameter and 30 μm in thickness. The cutting blade 34 is configured so as to be rotatable with the spindle 33 and for example, is rotated at a speed of 20,000 rpm. The blade cover 35 has cutting water supplying means 36 disposed at a position adjacent to the cutting blade 34. The cutting water supplying means 36 supplies cutting water to a position in which the laminate 20 is cut with the cutting blade 34. When cutting of the laminate 20 is carried out with the cutting blade 34, positioning (alignment) between the cutting blade 34 and a position in which the laminate 20 held on the holding table 31 is processed is carried out by use of alignment means not illustrated. The alignment means includes at least illuminating means and imaging means, which are not illustrated, and is configured so as to be able to image and detect the division lines 14 on the front surface 10a of the wafer 10 to be imaged from the transparent glass substrate 18 side. Moreover, in the dicing apparatus 30, the alignment means includes surface height detecting means detecting a height of a front surface of the laminate 20 upon alignment.

After the alignment is carried out by the alignment means, the cutting blade 34 being rotated with the spindle 33 at a high speed is positioned at an outer peripheral end of a region of the glass substrate 18 corresponding to a predetermined one of the division lines 14 on the wafer 10 constituting the laminate 20 held on the holding table 31. Then, a position of a lower end of the cutting blade 34 is lowered to cut the glass substrate 18 to such a height position that the glass substrate 18 is fully cut and the lower end of the cutting blade 34 reaches the adhesive layer B of the laminate 20, and the laminate 20 is moved with respect to the cutting blade 34 in an X-axis direction (feeding direction) illustrated with an arrow X, the X-axis direction parallel to the first direction described above. A feeding speed at this time is set to 50 mm/s, for example. Accordingly, as illustrated in FIG. 3, the region of the glass substrate 18 corresponding to the predetermined one of the division lines 14 on the wafer 10 constituting the laminate 20 is cut to form a cut groove 100. Then, moving means not illustrated moves the holding table 31 holding the laminate 20 under suction in the X-axis direction and index-feeds the holding table 31 by a pitch of the division line 14 in a direction perpendicular to the X-axis direction such that the cutting blade 34 is positioned to a next region of the glass substrate 18 corresponding to another division line 14 adjacent to the predetermined one division line 14 described above in the first direction to form another cut groove 100 along the next region. In this manner, a plurality of cut grooves 100 are formed along all of the division lines 14 extending in the first direction of the laminate 20 with the cutting blade 34 described above.

Figure 4A:
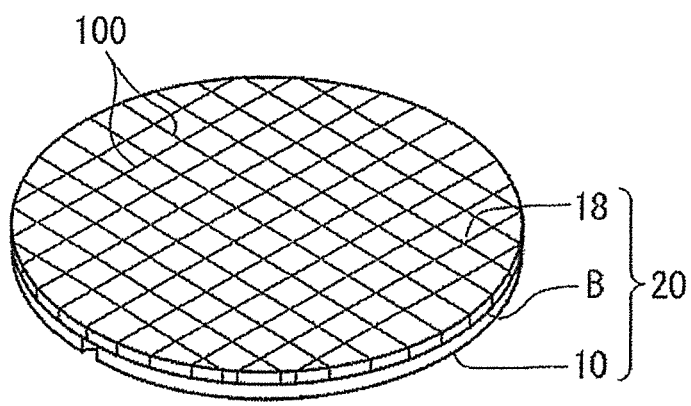
FIG. 4A is a perspective view of the laminate in which a cut groove is formed by carrying out the cut groove forming step.
Figure 4B:
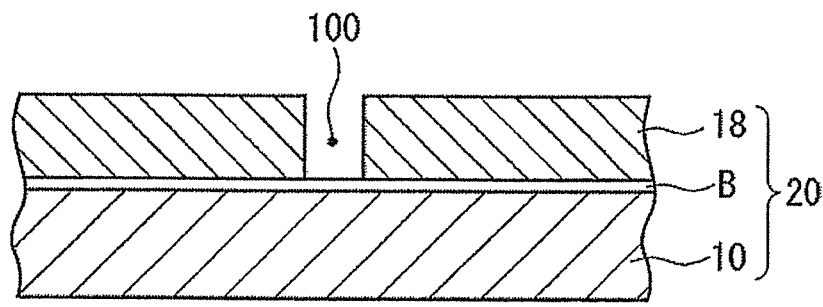
FIG. 4B is a partially enlarged cross-sectional view of the laminate with the cut groove formed.

After the cut grooves 100 are formed in the respective regions corresponding to all of the division lines 14 extending in the first direction of the laminate 20, the holding table 31 is rotated at 90°, so that a plurality of cut grooves 100 are similarly formed in respective regions of the glass substrate 18 corresponding to the division lines 14 extending in the second direction perpendicular to the first direction described above. Accordingly, as illustrated in FIG. 4A, the cut grooves 100 are formed in the respective regions of the glass substrate 18 corresponding to all of the division lines 14 on the wafer 10. As understood from the partially enlarged cross-sectional view of the laminate 20 illustrated in FIG. 4B, this cut groove 100 is a groove obtained by cutting the region of the glass substrate 18 corresponding to the division line 14 from the side of the glass substrate 18 of the laminate 20 and reaching the adhesive layer B, and not a groove by which the laminate 20 is fully divided. Thus, the cut groove forming step is completed.

(Laminate Supporting Step and Division Start Point Forming Step)

Figure 5:
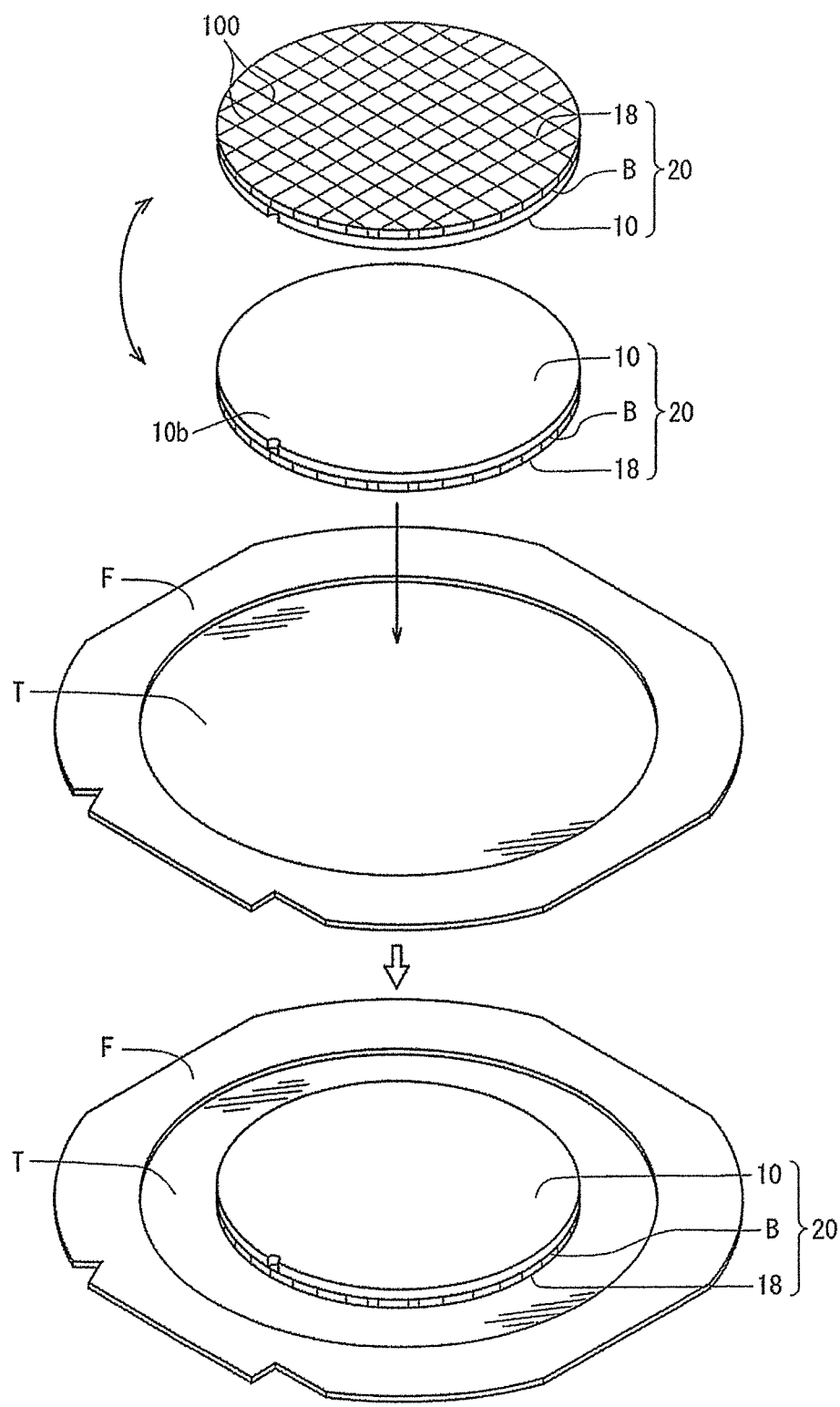
FIG. 5 is a perspective view illustrating a manner in which the laminate is supported to a frame through an expandable tape by carrying out a laminate supporting step.

After the cut groove forming step described above is carried out, a laminate supporting step and a division start point forming step are carried out. Referring to FIGS. 5 to 6B, the laminate supporting step and the division start point forming step will be described below.

Upon carrying out the laminate supporting step, as illustrated in FIG. 5, prepared is a supporting member in which an outer peripheral portion of an expandable tape T is attached to an annular frame F having an inside opening with a size large enough to accommodate the laminate 20 therein. After the supporting member is prepared, the laminate 20 with the cut grooves 100 formed therein is supported by the supporting member in a state in which the wafer 10 faces upward and the glass substrate 18 is attached to a center of a front surface of the expandable tape T. The expandable tape T has expandability and is provided with adhesion due to an adhesive or the like. The laminate 20 disposed on the expandable tape T is held on the annular frame F through the expandable tape T (see a lower portion of FIG. 5).

As described above, after the laminate supporting step is carried out, the division start point forming step is carried out. The division start point forming step in the present embodiment can be carried out using a laser processing apparatus 40 (only partly illustrated) illustrated in FIG. 6A. A description will be given below regarding the division start point forming step carried out by the laser processing apparatus 40.

Figure 6A:
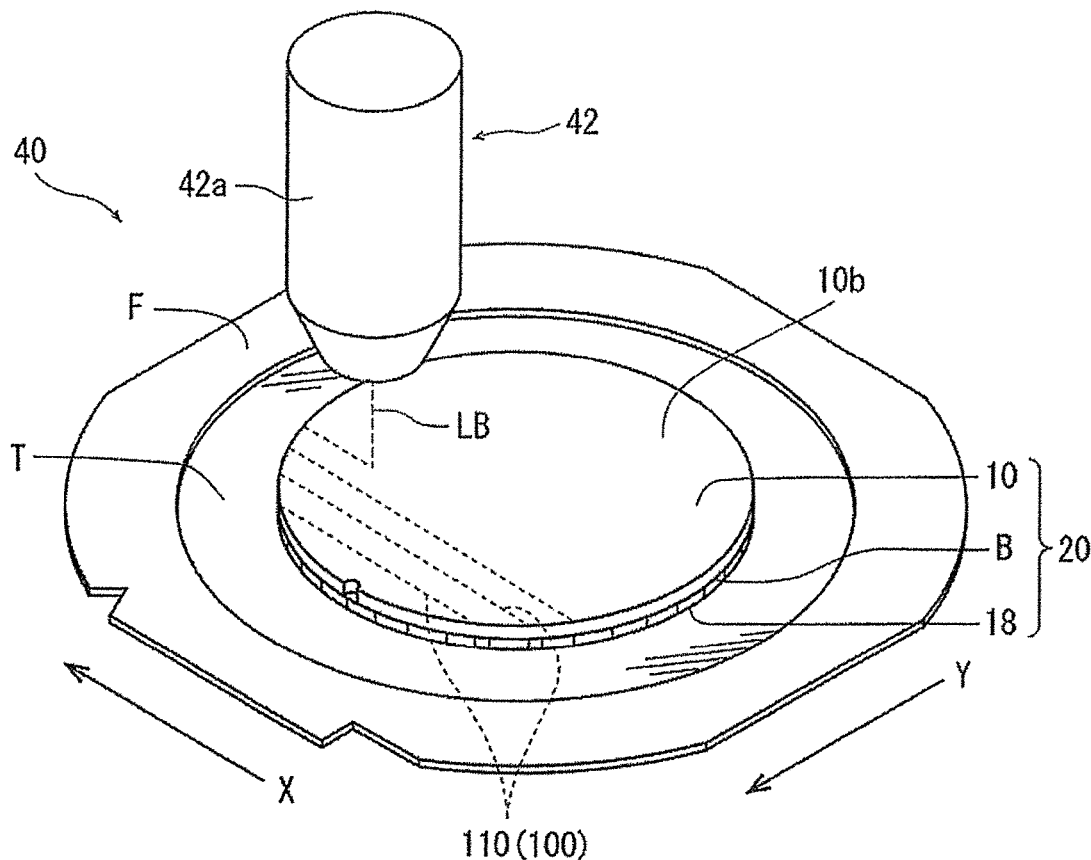
FIG. 6A is a perspective view illustrating a manner in which a division start point forming step is carried out.
Figure 6B:
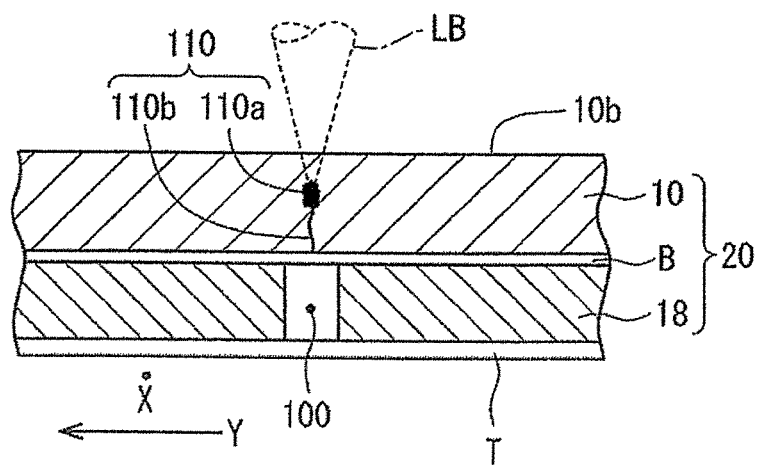
FIG. 6B is a partially enlarged cross-sectional view illustrating a state in which a division start point is formed in a wafer constituting the laminate by carrying out the division start point forming step.

As illustrated in FIG. 6A, the laser processing apparatus 40 includes a laser beam applying unit 42. The laser beam applying unit 42 includes an optical system including a laser oscillator not illustrated and includes focusing means 42*a* focusing a pulsed laser beam LB emitted from the laser oscillator to apply the focused laser beam LB to the laminate 20. As illustrated in FIG. 6B, a laser processing is carried out by positioning a focal point of a pulsed laser beam LB having a transmission wavelength to the wafer 10 inside the region of the back surface 10*b* of the wafer 10 corresponding to a predetermined one of the division lines 14 and applying the laser beam LB thereto to continuously form a modified layer 110*a*. When the division start point forming step is carried out by the laser beam applying unit 42, the laminate 20 held on the frame F is first held on a holding table (not illustrated) included in the laser processing apparatus 40. After the laminate 20 is held on the holding table, a height position of the back surface 10*b* of the wafer 10 is detected by use of alignment means not illustrated, and alignment between an irradiation position of the laser beam LB applied from the focusing means 42*a* and a position of a predetermined one of the division lines 14 formed on the front surface 10*a* side of the wafer 10 is carried out. The alignment means includes infrared illumination means and infrared imaging means, which are not illustrated, and is configured so as to be able to image the division lines 14 of the front surface 10*a* of the wafer 10 from the back surface 10*b* side of the wafer 10 to detect the division lines 14.

After alignment is carried out by the alignment means, the focusing means 42*a* is positioned at a region of the wafer 10 corresponding to a predetermined one of the division lines 14 and above a position of the outer peripheral end of the wafer 10 which is a starting position of laser processing, and a focal point of the laser beam LB to be applied from the focusing means 42*a* is positioned inside the region of the wafer 10 corresponding to the predetermined one of the division lines 14. Then, the laser beam applying unit 42 is operated, while moving means not illustrated causes the laminate 20 to move in the X-axis direction (feeding direction) illustrated with the arrow X with respect to the focusing means 42*a*. Thus, as understood from the partially enlarged cross-sectional view of the laminate 20 illustrated in FIG. 6B, a modified layer 110*a* is continuously formed along a predetermined position inside the wafer 10 and corresponding to each of the division lines 14, at the same time that a crack 110*b* reaching the adhesive layer B from the modified layer 110*a* is formed to form a division start point 110 serving as a start point of division. Note that, in FIG. 6B, the X-axis direction is a direction vertical to a sheet surface on which FIG. 6B is drawn.

Further, while the moving means not illustrated moves the holding table holding the laminate 20 in the X-axis direction and the Y-axis direction perpendicular to the X-axis direction appropriately, a plurality of the division start points 110 are formed so as to correspond to all of the division lines 14 in the first direction on the wafer 10 by the laser beam applying unit 42 described above. After the division start points 110 are formed so as to correspond to all of the division lines 14 in the first direction on the wafer 10, the holding table not illustrated is rotated at 90°, and the laser processing is similarly carried out also in the second direction perpendicular to the first direction such that the division start points 110 are formed inside respective regions corresponding to the division lines 14 on the wafer 10. Accordingly, the division start points 110 are formed along the respective regions corresponding to all of the division lines 14 on the wafer 10. Thus, the laminate supporting step and the division start point forming step in the present embodiment are carried out. Note that, in the embodiment described above, although the division start point forming step is carried out after the laminate supporting step, the present invention is not necessarily limited to the above process order of carrying out the laminate supporting step prior to the division start point forming step. The laminate supporting step may be carried out after the division start point forming step. In short, in the present invention, it is sufficient as long as the laminate supporting step is carried out at any timing at least after the cut groove forming step described above and before the dividing step which will be described later.

Note that the laser processing condition in the division start point forming step described above is set in the following, for example.

Wavelength: 1342 nm
Repetition frequency: 60 kHz
Average output power: 1 W
Feeding speed: 600 mm/s (Division Step)

Figure 7A:
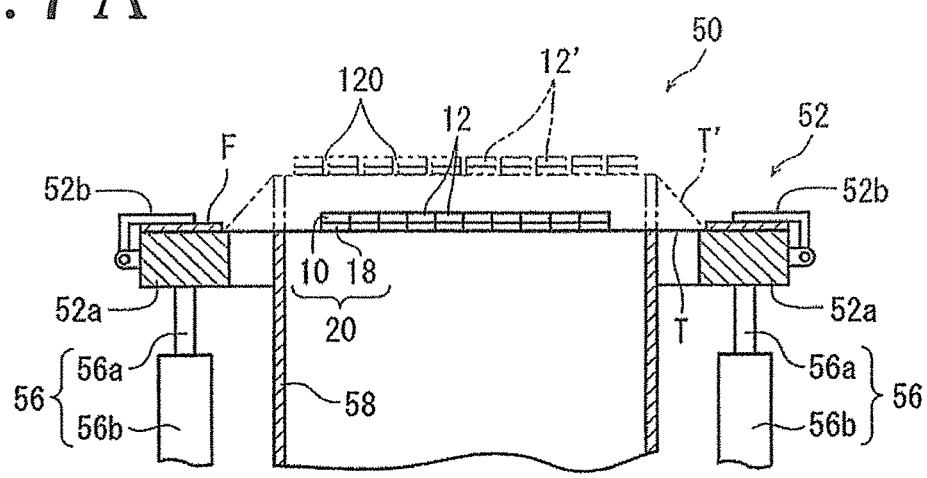
FIG. 7A is a partial cross-sectional view illustrating a manner in which a dividing step is carried out.

As described above, after the laminate 20 is supported to the annular frame F through the expandable tape T and the division start points 110 are formed along respective regions corresponding to all of the division lines 14 on the wafer 10 included in the laminate 20, carried out is a dividing step in which an external force is applied to the laminate 20 using a dividing apparatus 50 illustrated in FIG. 7A and the respective image sensors 12 formed in the wafer 10 of the laminate 20 are divided into individual image sensor chips 12'.

The dividing apparatus 50 illustrated in FIG. 7A includes frame holding means 52 holding the annular frame F supporting the laminate 20 thereon, and tape expanding means 56 expanding the expandable tape T attached to the frame F held on the frame holding means 52. The frame holding means 52 includes frame holding member 52a formed annularly so as to hold the annular frame F, and a plurality of clamps 52b as fixing means disposed on an outer periphery of the frame holding member 52a. An upper surface of the frame holding member 52a is formed to be flat, and the frame F is placed thereon. Then, the frame F placed on the frame holding member 52a is fixed onto the frame holding member 52a with the plurality of clamps 52b. The frame holding means 52 thus configured is supported by the tape expanding means 56 in a manner movable in a vertical direction.

An expansion drum 58 fixed on a base table not illustrated is disposed inside the annular frame holding member 52a. This expansion drum 58 is set to be smaller in diameter than an inner diameter of the frame F and larger in diameter than an outer diameter of the laminate 20 supported by the expandable tape T attached to the frame F. A plurality of the tape expanding means 56 in the present embodiment are disposed around the expansion drum 58 and include a plurality of piston rods 56a each upper end of which is connected to a lower surface of the frame holding member 52a, and a plurality of air cylinders 56b moving the respective piston rods 56a in the vertical direction such that the frame holding member 52a is movable in the vertical direction. Thus, the tape expanding means 56 including the plurality of piston rods 56a and the plurality of air cylinders 56b can selectively move the upper surface of the frame holding member 52a between a reference position at which the upper surface of the frame holding member 52a is at substantially the same level as the upper end of the expansion drum 58 as illustrated with a solid line in FIG. 7A and an expanded position at which the upper surface of the frame holding member 52a is a predetermined amount lower than the upper end of the expansion drum 58 as illustrated with a two-dot chain line in FIG. 7A.

The dividing apparatus 50 in the present embodiment is schematically configured in this manner, and the dividing step carried out by use of the dividing apparatus 50 will be described in more detail.

Figure 7B:
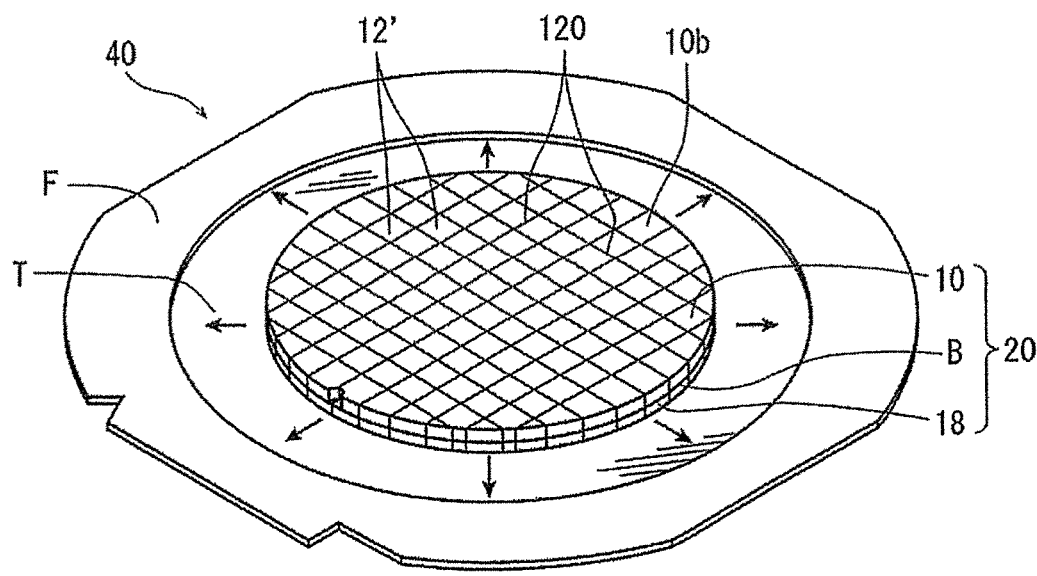
FIG. 7B is a perspective view illustrating the laminate which is divided into individual image sensor chips through the dividing step.

As described above, after the frame F supporting the laminate 20 thereon through the expandable tape T is placed on the frame holding member 52a and fixed with the clamps 52b, the plurality of air cylinders 56b included in the tape expanding means 56 are operated to lower the frame holding member 52a to the expanded position. Accordingly, the frame F fixed onto the frame holding member 52a is also lowered, so that the expandable tape T attached to the frame F is expanded (illustrated with a reference character T') while keeping contact with an upper end edge of the expansion drum 58 which is relatively moved higher than the frame holding member 52a as illustrated with the two-dot chain line in FIG. 7A. As a result, a tensile force is radially applied to the laminate 20 attached to the expandable tape T', so that the laminate 20 is fully divided along the division start points 110 formed along the division lines 14 to thereby form respective division grooves 120. After the division grooves 120 are formed in this manner, the tape expanding means 56 is operated to return the upper end position of the expansion drum 58 to the reference position at which the upper end position of the expansion drum 58 and the upper surface of the frame holding member 52a are the same level in height. In this case, the expandable tape T can maintain a state in which the tensile force is applied to the laminate 20 to some extent as illustrated in FIG. 7B since the expandable tape T is once expanded through the dividing step.

Figure 7C:
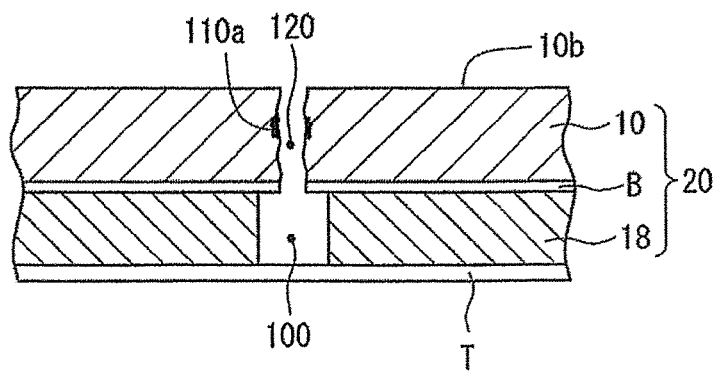
FIG. 7C is a partially enlarged cross-sectional view of the laminate which is divided into the individual image sensor chips through the dividing step.

In view of this, as understood from the partially enlarged cross-sectional view of the laminate 20 illustrated in FIG. 7C, even when the upper end position of the expansion drum 58 is returned to the reference position at which it is the same level in height as the upper surface of the frame holding member 52a, a gap interval between adjacent ones of the division grooves 120 can be maintained. As described above, the dividing step is completed. Note that, at this time, it is preferable that the expandable tape T in a region between the outer periphery of the laminate 20 and the inside opening of the frame F should be heated. By heating the expandable tape T in this region, the expandable tape T shrinks, so that an expanded state of the expandable tape T with respect to the laminate 20 can be more securely maintained. Moreover, in the subsequent steps, it is possible to favorably maintain the gap interval between adjacent ones of the division grooves 120.

According to the dividing step described above, the glass substrate 18 is divided along the cut grooves 100 in advance. Accordingly, an external force is applied to the division start points 110, so that the laminate 20 can be divided into individual image sensor chips 12'. Hence, the wafer 10 constituting the image sensor chips 12' is not divided with the cutting blade. Accordingly, a chipping is not generated in the outer periphery of the wafer 10, and quality of the image sensor chip 12' is not degraded.

(Water-Soluble Resin Filling Step)

Figure 8A:
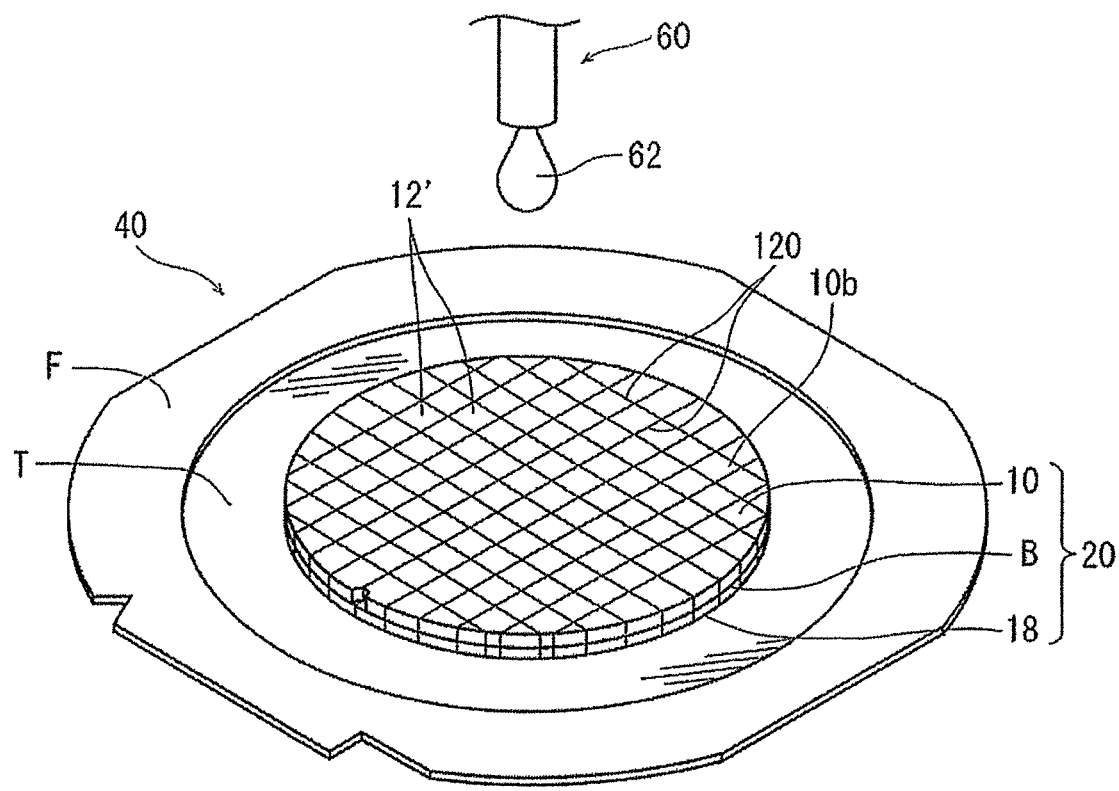
FIG. 8A is a perspective view illustrating a manner in which a water-soluble resin filling step is carried out.
Figure 8B:
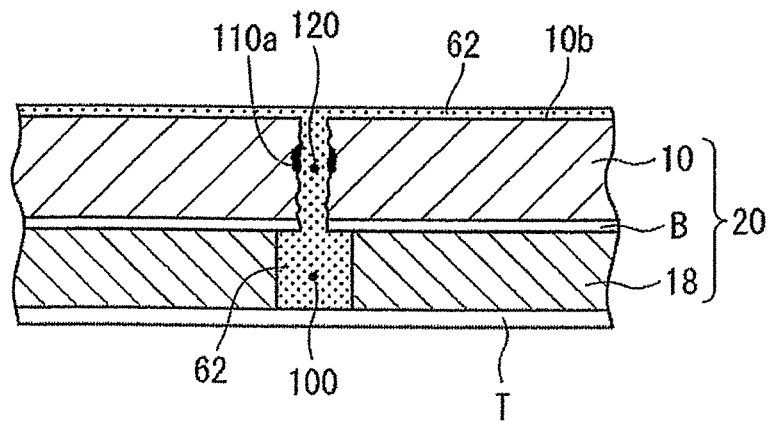
FIG. 8B is a partially enlarged cross-sectional view of the laminate with the water-soluble resin filled therein.

After the dividing step described above is carried out, the water-soluble resin filling step is carried out. Referring to FIGS. 8A and 8B, a manner in which the water-soluble resin filling step is carried out will be described.

As illustrated in FIG. 8A, the laminate 20 supported by the expandable tape T and having the division grooves 120 formed therein through the dividing step is positioned below water-soluble resin supplying means 60. After the laminate 20 is positioned below the water-soluble resin supplying means 60, a water-soluble liquid resin 62, for example, polyvinyl alcohol (PVA), which becomes solidified over time is dropped from the water-soluble resin supplying means 60. As described above, in the laminate 20, the division grooves 120 each of which maintains a predetermined gap interval with an adjacent division groove 120 are formed. As understood from the partially enlarged cross-sectional view of the laminate 20 illustrated in FIG. 8B, the dropped water-soluble resin 62 passes through the division groove 120 and is supplied also to the cut groove 100 which is formed on the glass substrate 18 side, and then, the cut groove 100 and the division groove 120 are filled with the water-soluble resin 62 while the back surface 10b of the wafer 10 constituting the laminate 20 is coated with the water-soluble resin 62. Note that the water-soluble resin 62 is not limited to polyvinyl alcohol described above, and it is only sufficient as long as the water-soluble resin 62 is a known water-soluble resin which is dissolved into a solvent such as water. For example, the water-soluble resin 62 may be polyvinyl acetal (including vinyl acetate copolymer), polyvinylpyrrolidone, or the like. Thus, the water-soluble resin filling step is completed.

(Modified Layer Removing Step)

Figure 9A:
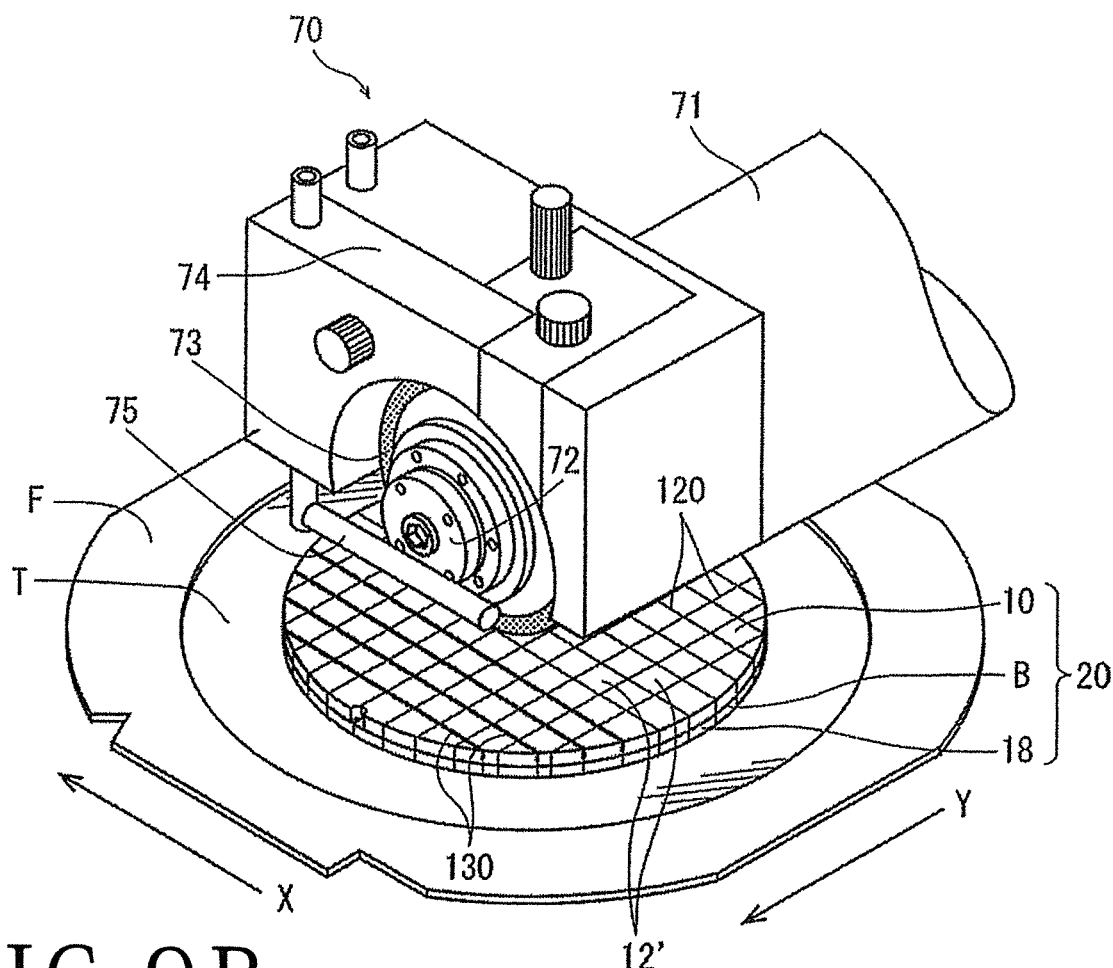
FIG. 9A is a perspective view illustrating a manner in which a modified layer removing step is carried out.
Figure 9B:
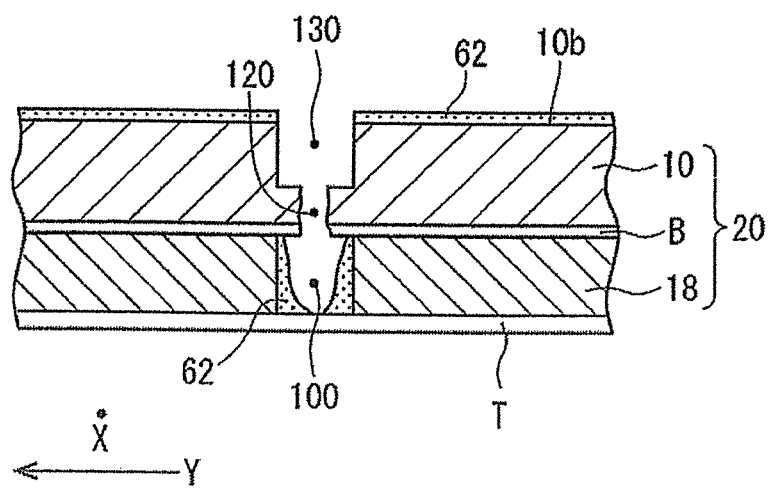
FIG. 9B is a partially enlarged cross-sectional view of the laminate with the modified layer removed.

As described above, after the water-soluble resin filling step is completed, the modified layer removing step is carried out. Referring to FIGS. 9A and 9B, a manner in which the modified layer removing step is carried out will be described below.

After the water-soluble resin filling step described above has been finished and a predetermined period of time has passed, the water-soluble resin 62 filled in the division grooves 120 becomes half-solidified or solidified. The laminate 20 in a state in which the water-soluble resin 62 is half-solidified or solidified is transferred to a dicing apparatus 70 illustrated in FIG. 9A and placed and held on a holding table (not illustrated) included in the dicing apparatus 70.

As illustrated in FIG. 9A, the dicing apparatus 70 includes a spindle unit 71. The spindle unit 71 includes a spindle 72, a cutting blade 73 fixed to a distal end portion of the spindle 72 and having a cutting edge on an outer periphery thereof, and a blade cover 74 protecting the cutting blade 73. The cutting blade 73 is, for example, an electroformed grindstone suitable for cutting a CMOS wafer and is set to be 50 mm in diameter and 40 μm in thickness. The cutting blade 73 is configured so as to be rotatable with the spindle 72 and for example, is rotated at a speed of 20,000 rpm. The blade cover 74 has cutting water supplying means 75 disposed at a position adjacent to the cutting blade 73. The cutting water supplying means 75 supplies cutting water to a position in which the laminate 20 is cut with the cutting blade 73. When cutting of the laminate 20 is carried out with the cutting blade 73, positioning (alignment) between the cutting blade 73 and a position in which the laminate 20 is processed, i.e., a predetermined one of the division grooves 120, is carried out by use of alignment means not illustrated. The alignment means includes at least illuminating means and imaging means, which are not illustrated, and is configured so as to be able to image and detect the division grooves 120 formed in the wafer 10 from the back surface 10b side of the wafer 10. Moreover, in the dicing apparatus 70, the alignment means includes height detecting means detecting a height of the upper surface of the laminate 20, that is, a height of the back surface 10b of the wafer 10, and the height detecting means detects a height of the front surface of the laminate 20 upon alignment.

After the alignment is carried out by the alignment means, the cutting blade 73 being rotated with the spindle 72 at a high speed is positioned at an outer peripheral end of the wafer 10 constituting the laminate 20 corresponding to a predetermined one of the division grooves 120. Then, a position of a lower end of the cutting blade 73 is positioned at a position a predetermined amount lower than the lower end of the modified layer 110a formed inside the wafer 10 in the division start point forming step described above. Then, the laminate 20 is moved with respect to the cutting blade 73 in the X-axis direction (feeding direction) illustrated with the arrow X. A feeding speed at this time is set to 50 mm/s. Accordingly, as illustrated in FIG. 9, the region where the modified layer 110a is formed is cut and removed along the region where a predetermined one of the division grooves 120 is formed in the back surface 10b of the wafer 10 constituting the laminate 20 to form a cut groove 130. Then, moving means not illustrated moves the holding table holding the laminate 20 under suction in the X-axis direction and index-feeds the holding table by a pitch of the division line 14 in a direction perpendicular to the X-axis direction such that the cutting blade 73 is positioned to a next region where the adjacent modified layer 110a is formed corresponding to another division groove 120 adjacent to the predetermined division groove 120 described above to form another cut groove 130 along the next region. In this manner, a plurality of cut grooves 130 are formed along all of the division grooves 120 extending in the first direction of the laminate 20 with the cutting blade 73 described above.

After the cut grooves 130 which remove the modified layers 110a are formed with respect to all of the division grooves 120 extending in the first direction of the laminate 20, the laminate 20 held on the holding table is rotated at 90°, so that a plurality of cut grooves 130 are similarly formed in respective positions corresponding to the division grooves 120 extending also in the second direction perpendicular to the first direction described above. Accordingly, the cut grooves 130 are formed along all of the division grooves 120 formed in the dividing step described above. As understood from the partially enlarged cross-sectional view of the laminate 20 illustrated in FIG. 9B, formation of the cut grooves 130 results in removal of the modified layers 110a formed inside the wafer 10 in the division start point forming step. In this manner, when the modified layers 110a are removed, since the water-soluble resin 62 is filled in the division grooves 120, dust generated from the modified layers 110a is discharged outside with the water-soluble resin 62 smoothly. Thus, the modified layer removing step is completed. Note that, according to this modified layer removing step, the water-soluble resin 62 filled in the cut grooves 100 and the division grooves 120 is removed to some extent by the cutting water supplied upon removing the modified layers 110a; however, a predetermined amount of the water-soluble resin 62 remains in the cut grooves 100.

Figure 10:
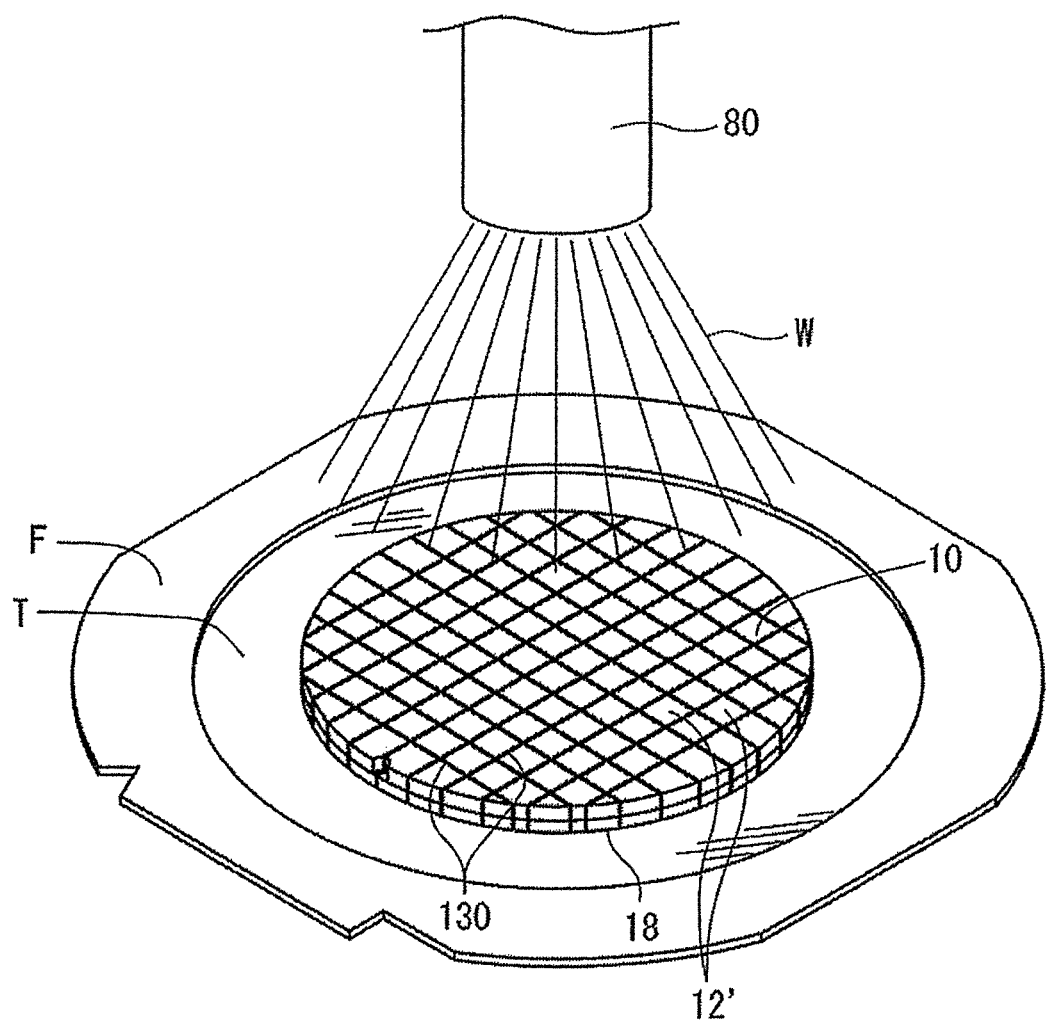
FIG. 10 is a perspective view illustrating a manner in which a water-soluble resin removing step is carried out.

After the modified layer removing step is completed, the water-soluble resin removing step is carried out. Referring to FIG. 10, a manner in which the water-soluble resin removing step is carried out will be described below.

After the modified layer removing step is completed, the laminate 20 supported to the frame F is positioned below water washing means 80. As described above, since heat has been applied to the expandable tape T between the outer periphery of the laminate 20 and the inside opening of the frame F in the dividing step, an expansion state is maintained due to shrinkage of the expandable tape T, so that a gap interval between adjacent ones of the cut grooves 130 is maintained. The water washing means 80 supplies cleaning water W to which a predetermined pressure is applied, to the back surface 10b of the wafer 10 on which these cut grooves 130 are exposed, and the cleaning water W is supplied from the cut grooves 130 to the cut grooves 100 formed on the glass substrate 18 side. As a result, the water-soluble resin 62 remaining in the division grooves 120 and the cut grooves 100 is completely removed. As described above, the water-soluble resin removing step is completed, and the laminate 20 having the glass substrate 18 disposed through the transparent adhesive layer B on the front surface 10a of the wafer 10 is divided into individual image sensor chips 12'.

As described above, according to the present embodiment, when the laminate 20 is divided into individual image sensor chips 12', the modified layer 110a formed inside the wafer 10 is removed with the water-soluble resin 62 by causing the cutting blade 73 to cut in the division groove 120. Accordingly, there is no possibility that dust generated from the modified layer 110a may be attached to a periphery of the image sensor chips 12' to cause degradation in quality of the image sensor chip 12'. In addition, although the cutting blade 73 is used in removing the modified layer 110a, the wafer 10 has been already divided into individual image sensor chips 12' by the division grooves 120 when the modified layer 110a is removed with the cutting blade 73, and accordingly, the water-soluble resin 62 is filled in the division grooves 120 to maintain the gaps between adjacent ones of the division grooves 120. As a result, an excessive load is not applied to the periphery of the wafer 10 constituting the image sensor chips 12', thereby preventing generation of a chipping or the like. Thus, an above-described problem that the quality of each of the image sensor chips 12' is lowered is eliminated.

The present invention is not limited to the above-described embodiment, but various modification examples are provided. In the embodiment described above, when the dividing step is completed, heat is applied to the expandable tape T between the outer periphery of the laminate 20 and the inside opening of the frame F to shrink the expandable tape T such that the expansion state of the expandable tape T is maintained, but the present invention is not limited to this. The expandable tape T right after the dividing step is completed is maintained to be expanded as a result of the dividing step for a while. Accordingly, in a case in which the water-soluble resin filling step is carried out without a time interval from the end of the dividing step, application of heat to the expandable tape T is not carried out, and after the modified layer removing step is completed, heat is applied to the expandable tape T between the outer periphery of the laminate 20 and the inside opening of the frame F to shrink the expandable tape T before carrying out the water-soluble resin removing step, and the expansion state of the expandable tape T may be maintained.

Moreover, in the embodiment described above, after the dividing step is carried out, the laminate 20 with the division grooves 120 formed therein is positioned below the water-soluble resin supplying means 60, and the water-soluble resin 62 is supplied to the back surface 10b of the wafer 10 constituting the laminate 20, so that the water-soluble resin 62 is filled in the division grooves 120 and the cut grooves 100. The present invention is, however, not limited thereto. For example, the water-soluble resin 62 is supplied onto the back surface 10b of the wafer 10 before the dividing step is carried out to carry out the dividing step before the water-soluble resin 62 starts solidifying. Also in this manner, the water-soluble resin 62 enters the division grooves 120 formed in the dividing step, so that it is possible to fill the cut grooves 100 and the division grooves 120 with the water-soluble resin 62.

Further, in the embodiment described above, the cut groove forming step in which the cut grooves 100 are formed in the glass substrate 18 is carried out by use of the dicing apparatus 30, and the modified layer removing step in which the modified layers 110a formed inside the wafer 10 are removed is carried out by use of the dicing apparatus 70. The present invention is, however, not limited thereto. In the present invention, the cut groove forming step and the modified layer removing step may be carried out by use of only either one of the dicing apparatus 30 or the dicing apparatus 70. In this case, it is sufficient if the cutting blade 34 and the cutting blade 73 are suitably replaced with each other depending on whether a cut portion is the glass substrate 18 or the wafer 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laminate processing method of dividing a laminate into individual image sensor chips, the laminate in which a glass substrate is disposed through a transparent adhesive layer on a front surface of a wafer where a plurality of image sensors are formed in a plurality of respective regions demarcated by a plurality of crossing division lines, the method comprising:
   a cut groove forming step of positioning a cutting blade from a side of the glass substrate constituting the laminate and cutting a region of the glass substrate corresponding to each of the division lines, thereby forming a cut groove reaching the adhesive layer in the glass substrate;
   a division start point forming step of positioning a focal point of a laser beam having a transmission wavelength to the wafer inside a region of the wafer corresponding to each of the division lines from a back surface of the wafer, applying the laser beam thereto, continuously forming a modified layer inside the wafer, and forming a crack reaching from the modified layer to the adhesive layer, thereby forming a division start point;
   a laminate supporting step of supporting the glass substrate side of the laminate through an expandable tape to an annular frame having an inside opening with a size large enough to accommodate the laminate therein, at least after the cut groove forming step is carried out;
   a dividing step of, after the division start point forming step and the laminate supporting step are carried out, expanding the expandable tape to form a division groove along the division start point, and dividing the laminate into individual image sensor chips along the division groove;
   a water-soluble resin filling step of filling a water-soluble resin in the division groove formed in the dividing step;
   a modified layer removing step of positioning a cutting blade in the division groove formed in the back surface of the wafer to cut the division groove in a state in which the water-soluble resin is solidified or half-solidified, thereby removing the modified layer; and
   a water-soluble resin removing step of supplying cleaning water from the back surface of the wafer with a state in which the expandable tape is expanded being maintained, thereby removing the water-soluble resin being filled in the cut groove and the division groove.

2. The laminate processing method according to claim 1, wherein
   the water-soluble resin is coated on the back surface of the wafer in advance before the dividing step is carried out, and the water-soluble resin is filled in the division groove from the back surface of the wafer to carry out the water-soluble resin filling step when the laminate is divided into individual image sensor chips in the dividing step.

3. The laminate processing method according to claim 1, wherein at any timing between completion of the dividing step and start of the water-soluble resin removing step, heat is applied to the expandable tape between an outer periphery of the laminate and the inside opening of the annular frame to shrink the expandable tape to thereby maintain the state in which the expandable tape is expanded.

\* \* \* \* \*